United States Patent
Malik et al.

(10) Patent No.: US 6,204,151 B1
(45) Date of Patent: Mar. 20, 2001

(54) SMOOTHING METHOD FOR CLEAVED FILMS MADE USING THERMAL TREATMENT

(75) Inventors: Igor J. Malik, Palo Alto; Sien G. Kang, Pleasanton, both of CA (US)

(73) Assignee: Silicon Genesis Corporation, Campbell, CA (US)

( * ) Notice: Subject to any disclaimer, the term of this patent is extended or adjusted under 35 U.S.C. 154(b) by 0 days.

(21) Appl. No.: 09/295,822

(22) Filed: Apr. 12, 1999

(51) Int. Cl.$^7$ .................... H01L 21/78; H01L 21/301; H01L 21/36; H01L 21/479
(52) U.S. Cl. ............................. 438/460; 438/476
(58) Field of Search .................. 438/460, 405, 438/455, 695, 780, 476

(56) References Cited

U.S. PATENT DOCUMENTS

| | | | |
|---|---|---|---|
| 3,964,957 | * 6/1976 | Walsh | 156/345 |
| 4,495,219 | * 1/1985 | Kato et al. | 427/82 |
| 4,530,149 | 7/1985 | Jastrzebski et al. | 29/571 |
| 4,906,594 | 3/1990 | Yoneda et al. | 437/228 |
| 5,198,071 | 3/1993 | Scudder et al. | 156/625 |
| 5,198,371 | 3/1993 | Li | 437/11 |

(List continued on next page.)

FOREIGN PATENT DOCUMENTS

| | | |
|---|---|---|
| 553 852 | 8/1993 | (EP) . |
| 905 767 | 3/1999 | (EP) . |

OTHER PUBLICATIONS

Centura Epi "Epitaxial Deposition Chamber Specifications" Brochure, Applied Materials, Mar. 1994.

EPI Centura System Specifications Brochure, Applied Materials, Oct. 1996.

Moriceau et al., "Hydrogen Annealing Treatment Used To Obtain Quality SOI Surfaces," *Proceedings of 1998 IEEE International SOI Conference*, pp. 37–38, from conference 10/5–8/98.

(List continued on next page.)

*Primary Examiner*—John F. Niebling
*Assistant Examiner*—Walter L. Lindsay, Jr.
(74) *Attorney, Agent, or Firm*—Townsend and Townsend and Crew LLP

(57) ABSTRACT

In a specific embodiment, the present invention provides a novel process for smoothing a surface of a separated film. The present process is for the preparation of thin semiconductor material films. The process includes a step of implanting by ion bombardment of the face of the wafer by means of ions creating in the volume of the wafer at a depth close to the average penetration depth of the ions, where a layer of gaseous microbubbles defines the volume of the wafer a lower region constituting a majority of the substrate and an upper region constituting the thin film. A temperature of the wafer during implantation is kept below the temperature at which the gas produced by the implanted ions can escape from the semiconductor by diffusion. The process also includes contacting the planar face of the wafer with a stiffener constituted by at least one rigid material layer. The process includes treating the assembly of the wafer and the stiffener at a temperature above that at which the ion bombardment takes place and adequate to create by a crystalline rearrangement effect in the wafer and a pressure effect in the microbubbles to create separation between the thin film and the majority of the substrate. The stiffener and the planar face of the wafer are kept in intimate contact during the stage to free the thin film from the majority of the substrate. The method also includes applying a combination of thermal treatment and an etchant to the thin film to reduce a surface roughness of the thin film to a predetermined value.

20 Claims, 2 Drawing Sheets

U.S. PATENT DOCUMENTS

| | | | |
|---|---|---|---|
| 5,213,986 | 5/1993 | Pinker et al. | 437/20 |
| 5,374,564 * | 12/1994 | Bruel | 437/24 |
| 5,427,052 | 6/1995 | Ohta et al. | 117/85 |
| 5,494,835 | 2/1996 | Bruel | 437/24 |
| 5,518,965 | 5/1996 | Menigaux | 437/228 |
| 5,559,043 | 9/1996 | Bruel | 437/24 |
| 5,686,980 * | 11/1997 | Hirayama et al. | 349/110 |
| 5,714,395 | 2/1998 | Bruel | 437/24 |
| 5,841,931 | 11/1998 | Foresi | 385/131 |
| 5,854,123 | 12/1998 | Sato et al. | 438/507 |
| 5,869,387 | 2/1999 | Sato et al. | 438/459 |
| 5,877,070 | 3/1999 | Goesele et al. | 438/458 |
| 5,966,625 | 10/1999 | Zhong et al. | 438/492 |
| 5,968,279 | 10/1999 | MacLeish et al. | 134/1.2 |
| 6,008,128 | 12/1999 | Habuka et al. | 438/695 |

OTHER PUBLICATIONS

Sato et al., "Suppression of Si Etching during Hydrogen Annealing of Solicon–on–Insulator," *Proceedings 1998 IEEE SOI Conference*, pp. 17–18, from conference of 10/5–8/98.

Tate et al., "defect Reduction of Bonded SOI Wafers by Post Anneal Process in H2 Ambient," *Proceedings 1998 IEEE SOI Conference*, pp. 141–142, from conference of 10/5–8/98.

* cited by examiner

SMOOTHING METHOD FOR CLEAVED FILMS MADE USING THERMAL TREATMENT

BACKGROUND OF THE INVENTION

The present invention relates to the manufacture of objects. More particularly, the present invention provides a technique for improving surface texture or surface characteristics of a film of material, e.g., silicon, silicon germanium, or others. The present invention can be applied to treating or smoothing a cleaved film from a layer transfer process for the manufacture of integrated circuits, for example. But it will be recognized that the invention has a wider range of applicability; it can also be applied to smoothing a film for other substrates such as multi-layered integrated circuit devices, three-dimensional packaging of integrated semiconductor devices, photonic devices, piezo-electronic devices, microelectromechanical systems ("MEMS"), sensors, actuators, solar cells, flat panel displays (e.g., LCD, AMLCD), doping semiconductor devices, biological and biomedical devices, and the like.

Integrated circuits are fabricated on chips of semiconductor material. These integrated circuits often contain thousands, or even millions, of transistors and other devices. In particular, it is desirable to put as many transistors as possible within a given area of semiconductor because more transistors typically provide greater functionality, and a smaller chip means more chips per wafer and lower costs. Some integrated circuits are fabricated on a slice or wafer, of single-crystal (monocrystalline) silicon, commonly termed a "bulk" silicon wafer. Devices on such "bulk" silicon wafer typically are isolated from each other. A variety of techniques have been proposed or used to isolate these devices from each other on the bulk silicon wafer, such as a local oxidation of silicon ("LOCOS") process, trench isolation, and others. These techniques, however, are not free from limitations. For example, conventional isolation techniques consume a considerable amount of valuable wafer surface area on the chip, and often generate a non-planar surface as an artifact of the isolation process. Either or both of these considerations generally limit the degree of integration achievable in a given chip. Additionally, trench isolation often requires a process of reactive ion etching, which is extremely time consuming and can be difficult to achieve accurately.

An approach to achieving very-large scale integration ("VLSI") or ultra-large scale integration ("ULSI") is by using a semiconductor-on-insulator ("SOI") wafer. An SOI wafer typically has a layer of silicon on top of a layer of an insulator material. A variety of techniques have been proposed or used for fabricating the SOI wafer. These techniques include, among others, growing a thin layer of silicon on a sapphire substrate, bonding a layer of silicon to an insulating substrate, and forming an insulating layer beneath a silicon layer in a bulk silicon wafer. In an SOI integrated circuit, essentially complete device isolation is often achieved using conventional device processing methods by surrounding each device, including the bottom of the device, with an insulator. An advantage SOI wafers have over bulk silicon wafers is that the area required for isolation between devices on an SOI wafer is less than the area typically required for isolation on a bulk silicon wafer.

SOI offers other advantages over bulk silicon technologies as well. For example, SOI offers a simpler fabrication sequence compared to a bulk silicon wafer. Devices fabricated on an SOI wafer may also have better radiation resistance, less photo-induced current, and less cross-talk than devices fabricated on bulk silicon wafers. Many problems, however, that have already been solved regarding fabricating devices on bulk silicon wafers remain to be solved for fabricating devices on SOI wafers.

For example, SOI wafers generally must also be polished to remove any surface irregularities from the film of silicon overlying the insulating layer. Polishing generally includes, among others, chemical mechanical polishing, commonly termed CMP. CMP is generally time consuming and expensive, and can be difficult to perform cost efficiently to remove surface non-uniformities. That is, a CMP machine is expensive and requires large quantities of slurry mixture, which is also expensive. The slurry mixture can also be highly acidic or caustic. Accordingly, the slurry mixture can influence functionality and reliability of devices that are fabricated on the SOI wafer.

From the above, it is seen that an improved technique for manufacturing a substrate such as an SOI wafer is highly desirable.

SUMMARY OF THE INVENTION

According to the present invention, a technique for treating a film of material is provided. More particularly, the present invention provides a method for treating a cleaved surface and/or an implanted surface using a combination of thermal treatment and chemical reaction, which can form a substantially smooth film layer from the cleaved surface.

In a specific embodiment, the present invention provides a novel process for smoothing a surface of a separated film. The present process is for the preparation of thin semiconductor material films. The process includes a step of implanting by ion bombardment of the face of the wafer by means of ions creating in the volume of the wafer at a depth close to the average penetration depth of the ions, where a layer of gaseous microbubbles defines the volume of the wafer a lower region constituting a majority of the substrate and an upper region constituting the thin film. A temperature of the wafer during implantation is kept below the temperature at which the gas produced by the implanted ions can escape from the semiconductor by diffusion. The process also includes contacting the planar face of the wafer with a stiffener constituted by at least one rigid material layer. The process includes treating the assembly of the wafer and the stiffener at a temperature above that at which the ion bombardment takes place and adequate to create by a crystalline rearrangement effect in the wafer and a pressure effect in the microbubbles to create separation between the thin film and the majority of the substrate. The stiffener and the planar face of the wafer are kept in intimate contact during the stage to free the thin film from the majority of the substrate. The method also includes applying a combination of thermal treatment and an etchant to the thin film to reduce a surface roughness of the thin film to a predetermined value.

Numerous benefits are achieved by way of the present invention over pre-existing techniques. For example, the present invention provides an efficient technique for forming a substantially uniform surface on an SOI wafer. Additionally, the substantially uniform surface is made by way of common hydrogen treatment and etching techniques, which can be found in conventional epitaxial tools. Furthermore, the present invention provides a novel uniform layer, which can be ready for the manufacture of integrated circuits. The present invention also relies upon standard fabrication gases such as HCl and hydrogen gas. In preferred embodiments, the present invention can improve bond interface integrity, improve crystal structure, and reduce defects in the substrate simultaneously during the process. Depending upon the embodiment, one or more of these benefits is present. These and other advantages or benefits are described throughout the present specification and are described more particularly below.

These and other embodiments of the present invention, as well as its advantages and features are described in more detail in conjunction with the text below and attached Figs.

DESCRIPTION OF THE SPECIFIC EMBODIMENT

According to the present invention, a technique for treating a film of material is provided. More particularly, the present invention provides a method for treating a cleaved surface and/or an implanted surface using a combination of thermal treatment and chemical reaction, which can form a substantially smooth film layer from the cleaved surface. The invention will be better understood by reference to the FIGS. and the descriptions below.

Figure 1:
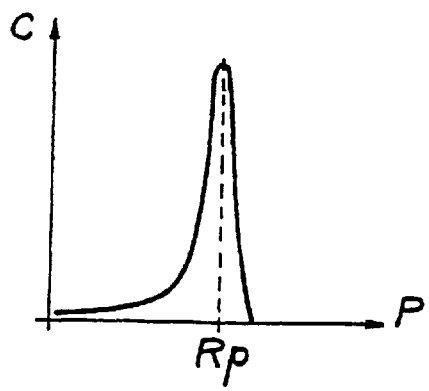
FIG. 1 is a simplified diagram of a concentration profile of the hydrogen ions as a function of the penetration depth according to an embodiment of the present invention.

In a specific embodiment, the invention will now be described in conjunction with the above drawings relates to the production of a thin film in a monocrystalline silicon wafer with the aid of H+ ion implantations. The implantation of H+ ions (e.g., protons) at 150 keV in a monocrystalline silicon wafer, whose surface corresponds to a principle crystallographic plane, e.g., a 1,0,0 plane leads, in the case of weak implantation doses (<$10^{16}$ atoms/cm$^2$) to a hydrogen concentration profile C as a function of the depth P having a concentration maximum for a depth Rp, as shown in a diagram of FIG. 1. In the case of a proton implantation in silicon, Rp is approximately 1.25 micrometers. This diagram is merely an illustration which should not limit the scope of the claims herein. One of ordinary skill in the art would recognize many variations, alternatives, and modifications.

For doses of approximately $10^{16}$ atoms/cm$^2$, the implanted hydrogen atoms start to form bubbles, which are distributed in the vicinity of a plane parallel to the surface. The plane of the surface corresponds to a principal crystallographic plane and the same applies with respect to the plane of the microbubbles, which is consequently a cleaving plane.

For an implanted dose of >$10^{16}$ atoms/cm$^2$, (e.g. 5×$10^{16}$ atoms/cm$^2$), it is possible to thermally trigger the coalescence between the bubbles inducing a cleaving into two parts of the silicon, an upper 1.2 micrometer thick film (the thin film) and the mass of the substrate. Hydrogen implantation is an advantageous example, because the braking process of said ion in silicon is essentially ionization (electronic braking), the braking of the nuclear type with atomic displacements only occurring at the end of the range. This is why few defects are created in the surface layer of the silicon and the bubbles are concentrated in the vicinity of the depth Rp (depth of the concentration maximum) over a limited thickness. This makes it possible to obtain the necessary efficiency of the method for moderate implanted doses (5×$10^{16}$ atoms/cm$^2$) and, following the separation of the surface layer, a surface having a limited roughness, but such roughness should be taken out before the manufacture of integrated circuits. The use of the process according to the invention makes it possible to choose the thickness of the thin film within a wide thickness range by choosing the implantation energy. This property is more important as the implanted ion has a low atomic number z.

Figure 2:
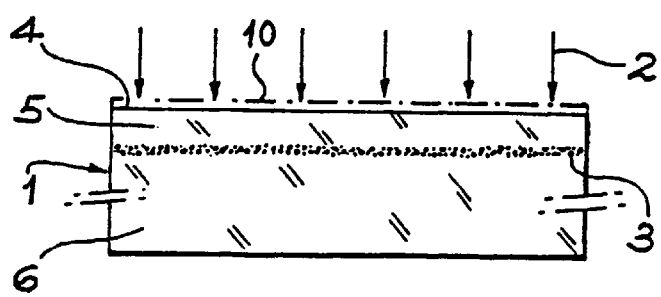
FIG. 2 is a simplified diagram of a monocrystalline semiconductor wafer used in the invention as the origin of the monocrystalline film, in section, exposed to a bombardment of H+ ions and within which has appeared a gas microbubble layer produced by the implanted particles.

FIG. 2 shows the semiconductor wafer 1 optionally covered with an encapsulating layer 10 subject to an ion bombardment 2 of H+ ions through the planar face 4, which is parallel to a principal crystallographic plane. This diagram is merely an illustration which should not limit the scope of the claims herein. One of ordinary skill in the art would recognize many variations, alternatives, and modifications. It is possible to see the microbubble layer 3 parallel to the face 4. The layer 3 and the face 4 define the thin film 5. The remainder of the semiconductor substrate 6 constitutes the mass of the substrate.

Figure 3:
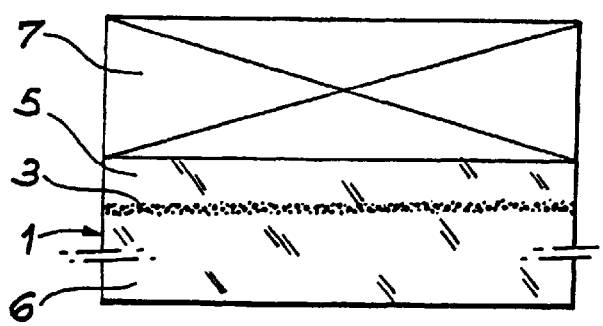
FIG. 3 is a simplified diagram of a semiconductor wafer shown in FIG. 2 and covered with a stiffener.

FIG. 3 shows a simplified diagram of the stiffener 7 which is brought into intimate contact with the face 4 of the semiconductor wafer 1. This diagram is merely an illustration which should not limit the scope of the claims herein. One of ordinary skill in the art would recognize many variations, alternatives, and modifications. In an interesting embodiment of the invention, ion implantation in the material takes place through a thermal silicon oxide encapsulating layer 10 and the stiffener 7 is constituted by a silicon wafer covered by at least one dielectric layer. Another embodiment uses an electrostatic pressure for fixing the stiffener to the semiconductor material. In this case, a silicon stiffener is chosen having an e.g. 5000 Angstrom thick silicon oxide layer. The planar face of the wafer is brought into contact with the oxide of the stiffener and between the wafer and the stiffener is applied a potential difference of several dozen volts. The pressures obtained are then a few $10^5$ to $10^6$ Pascal.

Figure 4:
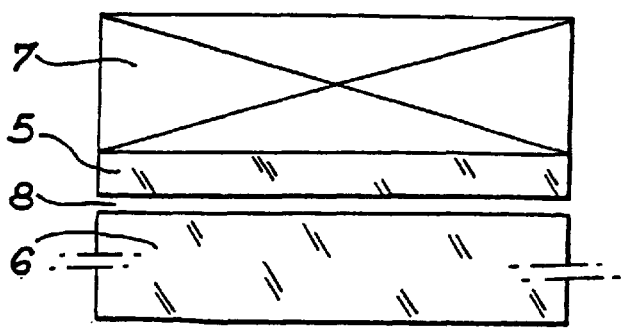
FIG. 4 is a simplified diagram of an assembly of the semiconductor wafer and the stiffener shown in FIG. 3 at the end of the heat treatment phase, when cleaving has taken place between the film and the substrate mass.

FIG. 4 shows a simplified diagram of the film 5 joined to the stiffener 7 separated by the space 8 from the mass of the substrate 6. This diagram is merely an illustration which should not limit the scope of the claims herein. One of ordinary skill in the art would recognize many variations, alternatives, and modifications. The diagram shows that the film is separated from the mass of the substrate. The surface of the film is generally rough and often requires additional processing.

Figure 5:
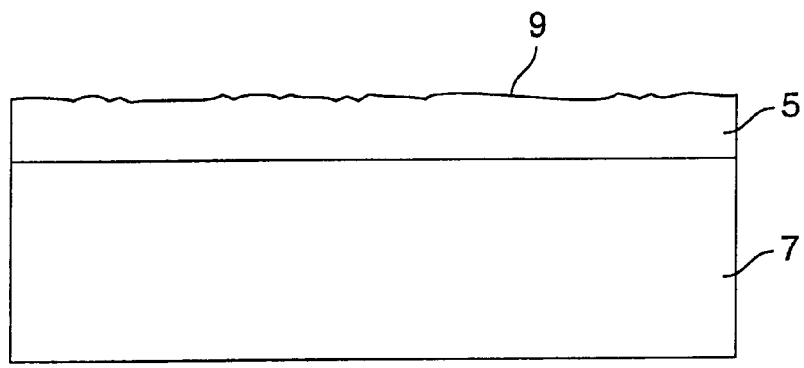
FIG. 5 is a simplified diagram of a removed film attached to a stiffener according to an embodiment of the present invention.

FIG. 5 is a simplified diagram of a removed film attached to a stiffener according to an embodiment of the present invention. This diagram is merely an illustration which should not limit the scope of the claims herein. One of ordinary skill in the art would recognize many variations, alternatives, and modifications. The film has an upper cleaved surface 9, which generally has a certain roughness.

The roughness is often greater than that which is generally acceptable for manufacturing integrated circuits. In silicon wafers, for example, the surface roughness can be greater than about 10 nanometers root mean square ("RMS") or greater. Alternatively, the surface roughness is about 2–8 nanometers root mean square and greater. During the cleaving process, most of the hydrogen has escaped. However, it is possible that a portion of the hydrogen, even a substantial portion of the hydrogen remain in the detached film. In some embodiments, the roughness can be polished by way of mechanical processes such as chemical mechanical planarization, touch polishing, and the like. Alternatively, the mechanical polishing process can be used alone or even combined with chemical processes, which will be described more fully below.

Figure 6:
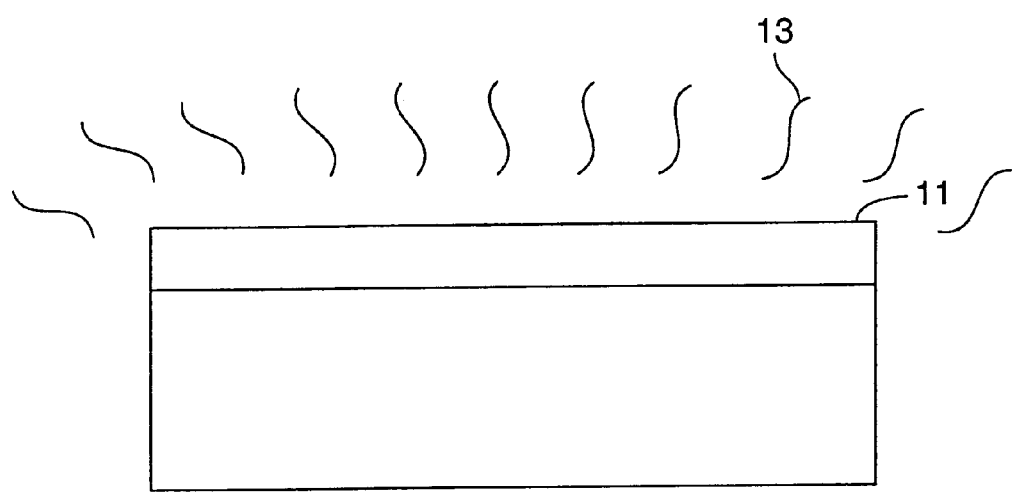
FIG. 6 is a simplified diagram of a smoothed film attached to a stiffener according to an embodiment of the present invention

FIG. 6 is a simplified diagram of a smoothed film attached to a stiffener according to an embodiment of the present invention. This diagram is merely an example, which should not limit the scope of the claims herein. One of ordinary skill in the art would recognize many other variations, alternatives, and modifications. To smooth or treat surface 9, the substrate is subjected to thermal and chemical treatment 13. In particular, the substrate is also subjected to an etchant including a halogen bearing compound such as HCl, HBr, HI, HF, and others. The etchant can also be a fluorine bearing compound such as $SF_6$, $C_xF_x$.

In preferred embodiments, the present substrate undergoes treatment using a combination of etchant and thermal treatment in a hydrogen bearing environment. In a specific embodiment, the etchant is HCl gas or the like. The thermal treatment uses a hydrogen etchant gas. In some embodiments, the etchant gas is a halogenated gas, e.g., HCl, HF, HI, HBr, $SF_6$, $CF_4$, $NF_3$, and $CCl_2F_2$. The etchant gas can also be mixed with another halogen gas, e.g., chlorine, fluorine. The thermal treatment can be from a furnace, but is preferably from a rapid thermal processing tool such as an RTP tool. Alternatively, the tool can be from an epitaxial chamber, which has lamps for rapidly heating a substrate. In an embodiment using a silicon wafer and hydrogen gas, the tool can heat the substrate at a rate of about 10 Degrees Celsius/second and greater or 20 Degrees Celsius/second and greater, depending upon the embodiment.

In one embodiment, it is believed that the hydrogen particles in the detached surface improves the surface smoothing process. Here, the hydrogen particles have been maintained at a temperature where they have not diffused out of the substrate. In a specific embodiment, the concentration of hydrogen particles ranges from about $10^{21}$ to about $5 \times 10^{22}$ atoms/cm$^3$. Alternatively, the concentration of hydrogen particles is at least about $6 \times 10^{21}$ atoms/cm$^3$. Depending upon the embodiment, the particular concentration of the hydrogen particles can be adjusted.

Still further in other embodiments, the present substrate undergoes a process of hydrogen treatment or implantation before thermal treatment purposes. Here, the substrate, including the detached film, is subjected to hydrogen bearing particles by way of implantation, diffusion, or any combination thereof. In some embodiments, where hydrogen has diffused out from the initial implant, a subsequent hydrogen treatment process can occur to increase a concentration of hydrogen in the detached film. A finished wafer after smoothing or surface treatment is shown in the Fig. Here, the finished wafer includes a substantially smooth surface 11, which is generally good enough for the manufacture of integrated circuits without substantial polishing or the like.

Moreover, the present technique for finishing the cleaved surface can use a combination of etchant, deposition, and thermal treatment to smooth the cleaved film. Here, the cleaved film is subjected to hydrogen bearing compounds such as HCl, HBr, HI, HF, and others. Additionally, the cleaved film is subjected to for example, deposition, during a time that the film is subjected to the hydrogen bearing compounds, which etch portions of the cleaved film. Using a silicon cleaved film for example, the deposition may occur by way of a silicon bearing compound such as silanes, e.g., $Si_xCl_yH_z$, $SiH_4$, $SiCl_x$, and other silicon compounds. Accordingly, the present method subjects the cleaved film to a combination of etching and deposition using a hydrogen bearing compound and a silicon bearing compound. Additionally, the cleaved surface undergoes thermal treatment while being subjected to the combination of etchant and deposition gases. The thermal treatment can be from a furnace, but is preferably from a rapid thermal processing tool such as an RTP tool. Alternatively, the tool can be from an epitaxial chamber, which has lamps for rapidly heating a substrate. In an embodiment using a silicon wafer and hydrogen gas, the tool can heat the substrate at a rate of about 10 Degrees Celsius and greater or 20 Degrees Celsius and greater, depending upon the embodiment. The temperature can be maintained at about 1000 to about 1200 Degrees Celsius and greater. The substrate can also be maintained at a pressure of about 1 atmosphere, but is not limiting.

In a further embodiment, the present method can also include an epitaxial deposition step following the smoothing step. The deposition step can form epitaxial silicon or other materials overlying the film. In a specific embodiment, the silicon-on-insulator substrate undergoes a series of process steps for formation of integrated circuits thereon. These processing steps are described in S. Wolf, Silicon Processing for the VLSI Era (Volume 2), Lattice Press (1990), which is hereby incorporated by reference for all purposes.

Although the above has been generally described in terms of a PIII system, the present invention can also be applied to a variety of other plasma systems. For example, the present invention can be applied to a plasma source ion implantation system. Alternatively, the present invention can be applied to almost any plasma system where ion bombardment of an exposed region of a pedestal occurs. Accordingly, the above description is merely an example and should not limit the scope of the claims herein. One of ordinary skill in the art would recognize other variations, alternatives, and modifications.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A process for the preparation of thin semiconductor material films, wherein the process comprises subjecting a semiconductor material wafer having a planar face and whose plane, is substantially parallel to a principal crystallographic plane, the process comprising:

implanting by ion bombardment of the face of said wafer by means of ions creating in the volume of said wafer at a depth close to the average penetration depth of said ions, a layer of gaseous microbubbles defining in the volume of said wafer a lower region constituting a majority of the substrate and an upper region constituting the thin film, the temperature of the wafer during implantation being kept below the temperature at which the gas produced by the implanted ions can escape from the semiconductor by diffusion;

contacting the planar face of said wafer with a stiffener constituted by at least one rigid material layer;

treating the assembly of said wafer and said stiffener at a temperature above that at which the ion bombardment takes place and adequate to created, by a crystalline rearrangement effect in the wafer and a pressure effect in the microbubbles, a separation between the thin film and the majority of the substrate, the stiffener and the planar face of the wafer being kept in intimate contact during said stage to free the thin film from the majority of the substrate; and applying a combination of thermal treatment and an etchant to said thin film to reduce a surface roughness of said thin film to a predetermined value, wherein said thermal treatment increases a temperature of said thin film to about 1,000 Degrees Celsius and greater, said temperature increasing about 10 Degrees Celsius per second and greater.

2. The method of claim 1 wherein said ions comprise a hydrogen bearing species.

3. The method of claim 1 wherein said ions are derived from hydrogen gas.

4. The method of claim 1 wherein said predetermined value is greater than about two nanometers root mean square.

5. The method of claim 1 wherein said predetermined value is less than about 1 nanometers root mean square.

6. The method of claim 1 wherein said predetermined value is less than about 0.1 nanometer root mean square.

7. The method of claim 1 wherein said etchant comprises a hydrogen bearing compound.

8. The method of claim 1 wherein said etchant comprising a halogen bearing compound is selected from at least $Cl_2$, HCl, HBr, HI, and HF.

9. The method of claim 1 wherein said etchant comprises a fluorine bearing compound.

10. The method of claim 9 wherein said fluorine bearing compound is selected from $SF_6$, $CF_4$, $NF_3$, and $CCl_2F_2$.

11. A process for the preparation of thin semiconductor material films, wherein the process comprises subjecting a semiconductor material wafer having a planar face and whose plane, is substantially parallel to a principal crystallographic plane, the process comprising:

implanting by ion bombardment of the face of said wafer by means of ions creating in the volume of said wafer at a depth close to the average penetration depth of said ions, a layer of gaseous microbubbles defining in the volume of said wafer a lower region constituting a majority of the substrate and an upper region constituting the thin film, the temperature of the wafer during implantation being kept below the temperature at which the gas produced by the implanted ions can escape from the semiconductor by diffusion;

contacting the planar face of said wafer with a stiffener constituted by at least one rigid material layer;

treating the assembly of said wafer and said stiffener at a temperature above that at which the ion bombardment takes place and adequate to create, by a crystalline rearrangement effect in the wafer and a pressure effect in the microbubbles, a separation between the thin film and the majority of the substrate, the stiffener and the planar face of the wafer being kept in intimate contact during said stage to free the thin film from the majority of the substrate; and applying a combination of thermal treatment and an etchant to said thin film to reduce a surface roughness of said thin film to a predetermined value, wherein said thermal treatment increases a temperature of said thin film to about 1,000 Degrees Celsius and greater, said temperature increasing about 20 Degrees Celsius per second and greater.

12. The method of claim 11 wherein said ions comprise a hydrogen bearing species.

13. The method of claim 11 wherein said ions are derived from hydrogen gas.

14. The method of claim 11 wherein said predetermined value is greater than about two nanometers root mean square.

15. The method of claim 11 wherein said predetermined value is less than about 1 nanometers root mean square.

16. The method of claim 11 wherein said predetermined value is less than about 0.1 nanometer root mean square.

17. The method of claim 11 wherein said etchant comprises a hydrogen bearing compound.

18. The method of claim 11 wherein said etchant comprising a halogen bearing compound is selected from at least $Cl_2$, HCl, HBr, HI, and HF.

19. The method of claim 11 wherein said etchant comprises a fluorine bearing compound.

20. The method of claim 19 wherein said fluorine bearing compound is selected from $SF_6$, $CF_4$, $NF_3$, and $CCl_2F_2$.

* * * * *